United States Patent [19]
Watanabe

[11] Patent Number: 5,808,490
[45] Date of Patent: Sep. 15, 1998

[54] METHOD AND CIRCUIT FOR CONTROLLING A BUS IN SYSTEM AND SEMICONDUCTOR INTEGRATED CIRCUIT DEVICE USING THE SAME, WHEREIN THE CONTROLLING CIRCUIT COMPRISES A LATCH FOR HOLDING A VOLTAGE LEVEL ON THE BUS

[75] Inventor: Hiroaki Watanabe, Yokohama, Japan

[73] Assignee: Fujitsu Limited, Kawasaki, Japan

[21] Appl. No.: 831,954

[22] Filed: Apr. 2, 1997

Related U.S. Application Data

[63] Continuation of Ser. No. 257,037, Jun. 8, 1994, abandoned.

[30] Foreign Application Priority Data

Aug. 13, 1993 [JP] Japan ................................ 5-201509

[51] Int. Cl.$^6$ ........................................................ H03K 5/00
[52] U.S. Cl. ................................ 327/94; 327/225; 326/86
[58] Field of Search .................................... 327/91, 99, 225, 327/565, 94, 95, 230; 326/38, 39, 41, 86, 113

[56] References Cited

U.S. PATENT DOCUMENTS

| 4,970,410 | 11/1990 | Matsushita et al. | |
|---|---|---|---|
| 5,023,484 | 6/1991 | Pathak et al. | 326/40 |
| 5,302,866 | 4/1994 | Chiang et al. | 326/40 |
| 5,399,912 | 3/1995 | Murata et al. | 327/94 |
| 5,414,305 | 5/1995 | Nakamura et al. | 327/95 |

Primary Examiner—Timothy P. Callahan
Assistant Examiner—Jung Ho Kim
Attorney, Agent, or Firm—Staas & Halsey

[57] ABSTRACT

A bus to which a bus control circuit and at least one electronic circuit are connected is controlled by a) storing a signal level which is output to the bus when the bus is in an active state, and b) fixing the bus to the signal level stored in the step a) when the bus switches to an inactive state.

13 Claims, 7 Drawing Sheets

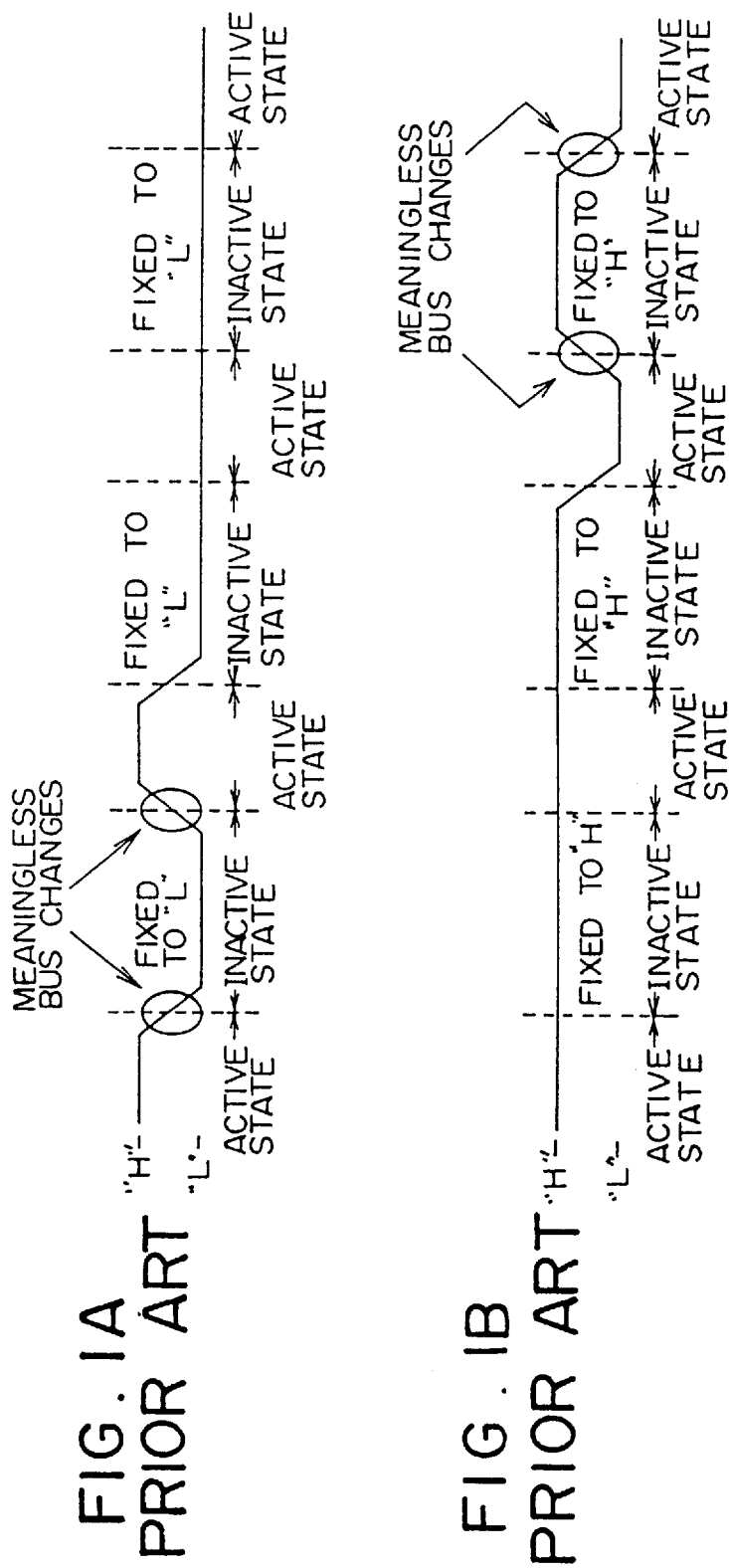

METHOD AND CIRCUIT FOR CONTROLLING A BUS IN SYSTEM AND SEMICONDUCTOR INTEGRATED CIRCUIT DEVICE USING THE SAME, WHEREIN THE CONTROLLING CIRCUIT COMPRISES A LATCH FOR HOLDING A VOLTAGE LEVEL ON THE BUS

This application is a continuation of application Ser. No. 08/257,037, filed Jun. 8, 1994, now abandoned.

BACKGROUND OF THE INVENTION

1. Field of the Invention

The present invention generally relates to a method and circuit for controlling a bus in a system, and more particularly to a method and circuit for reducing power consumed in a bus control circuit by reducing the number of times that the level of a bus connected to the bus control circuit changes.

2. Description of the Prior Art

Recently, a CMOS circuit has been used to form a bus control circuit which drives a bus connected to devices such as LSI chips. The CMOS bus control circuit has a disadvantage in which latchup, noise and/or pass-through current may occur when an output terminal of the CMOS bus control circuit is opened. Hence, it is not possible to set the CMOS bus control circuit to the open state. Conventionally, a pull-up resistor or a pull-down resistor is connected to the output terminal of the CMOS bus control circuit in order to prevent the CMOS bus control circuit from setting to the open state. Hence, the bus is set to either a high level or a low level by means of the pull-up resistor or the pull-down resistor.

When the pull-up resistor is connected to the output terminal of the CMOS bus control circuit, namely the bus, a wasteful current flows in the CMOS bus control circuit in the case where the CMOS bus control circuit sets the bus to the low level. When the pull-down resistor is connected to the output terminal of the CMOS bus control circuit, namely to the bus, a wasteful current flows in the CMOS circuit in the case where the CMOS bus control circuit sets the bus to the high level. Particularly, the above wasteful currents cause a problem when the device having the CMOS bus control circuit is driven by a battery, because the time during which the battery capability of providing sufficient power (i.e., the effective battery life) is shortened.

With the above in mind, it has been proposed that a circuit be used instead of the pull-up and pull-down resistors, which continuously outputs the low-level or high-level signal to the bus when the bus is in the inactive state, whereby the bus is fixed to either the low level or the high level. According to the above proposed manner, it is possible to reduce substantially the power consumed in the CMOS bus control circuit. However, there is still a disadvantage in that a pass-through current flows in the CMOS bus control circuit when the bus is switched from the active state to the inactive state.

The above disadvantage will be described in detail with reference to FIGS. 1A and 1B. FIG. 1A shows a bus operation in the case where the bus is fixed to the low level ("L") by means of a circuit connected to the bus when the bus is in the inactive state. FIG. 1B shows a bus operation in the case where the bus is fixed to the high level ("H") by means of the above circuit when the bus in the inactive state.

As shown in FIG. 1A, in the case where the bus in the inactive state is fixed to the low level, a wasteful current flows due to a change in the level of the bus when the bus is switched to the high level (active state), the low level (inactive state) and then the high level (active state) in this order. As shown in FIG. 1B, in the case where the bus in the inactive state is fixed to the high level, a wasteful current flows due to a change in the level of the bus when the bus is switched to the low level (active state), the high level (inactive state) and then the low level (active state).

SUMMARY OF THE INVENTION

It is a general object of the present invention to provide a method and circuit for reducing power consumed in a bus control circuit and a semiconductor integrated circuit device using the same in which the above disadvantages are eliminated.

A more specific object of the present invention is to provide a method and circuit for reducing power consumed in a bus control circuit whereby a reduction of power consumed in an electronic device having the bus control circuit can be achieved.

The above objects of the present invention are achieved by a method for controlling a bus to which a bus control circuit and at least one electronic circuit are connected, the method comprising the steps of: a) storing a signal level which is output to the bus when the bus is in an active state; and b) fixing the bus to the signal level stored in the step a) when the bus switches to an inactive state.

Preferably, the step b) comprises the step of connecting a resistance element to the bus on the basis of the signal level stored in the step a).

The above objects of the present invention are achieved by a bus control circuit for controlling a bus to which at least electronic circuit is connected, the bus control circuit comprising: first means for storing a signal level which is output to the bus when the bus is in an active state; and second means for fixing the bus to the signal level stored in the first means when the bus switches to an inactive state.

Preferably, the first means comprises latch means for latching the signal level of the bus when the bus is in the active state and the second means comprises switch means for outputting, to the bus, either the signal level of the bus, as latched in the latch means, or an output signal to be sent to the bus, according to an output control signal indicating that the bus should be set to the active state or the inactive state. The switch means outputs the signal level of the bus, latched in the latch means, to the bus when the bus is switched to the inactive state.

Preferably, the first means comprises switch means for outputting either the signal level of the bus or an output signal to be sent to the bus according to an output control signal indicating that the bus should be set to the active state or the inactive state; and the second means comprises latch means for latching a selected signal from the switch means when the bus is in the active state and for outputting a latched, selected signal to the bus when the bus is switched to the inactive state.

Preferably, the first means comprises latch means for latching the signal level of the bus when the bus is in the active state and the second means comprises switch means for connecting, on the basis of the signal level latched in the latch means, either a pull-up resistor or a pull-down resistor to the bus when the bus is switched to the inactive state.

The above-mentioned objects of the present invention are achieved by a semiconductor integrated circuit device having a bus control circuit for controlling a bus to which at least one integrated circuit device is connected, the semiconductor integrated circuit device comprising first means for storing a signal level which is output to the bus when the bus is in an active state and second means for fixing the bus to the signal level stored in the first means when the bus switches to an inactive state.

BRIEF DESCRIPTION OF THE DRAWINGS

Other objects, features and advantages of the present invention will become more apparent from the following detailed description when read in conjunction with the accompanying drawings, in which:

FIGS. 1A and 1B are timing charts of conventional bus operations;

DESCRIPTION OF THE PREFERRED EMBODIMENTS

Figure 2A:
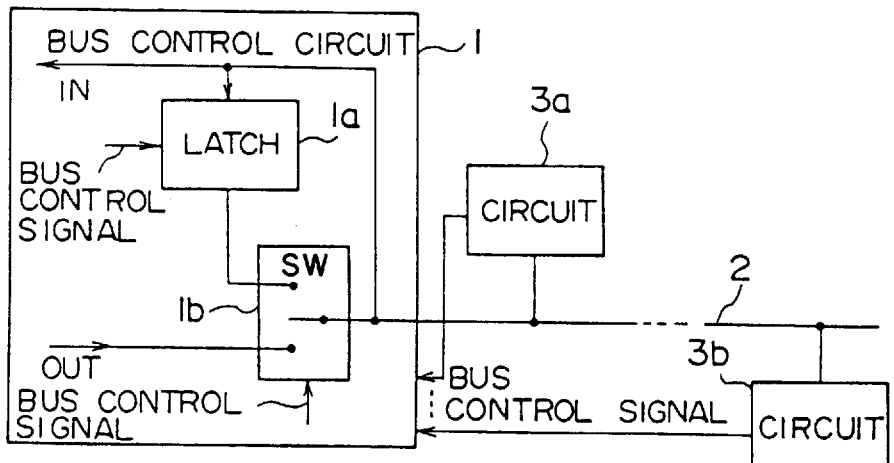
FIG. 2A is a block diagram showing a first aspect of the present invention.

FIG. 2A is a block diagram of a first aspect of the present invention. A bus control circuit 1 controls a bus 2 connected thereto. A plurality of circuits or devices 3a and 3b are connected to the bus 2. The bus control circuit 1 includes a latch unit 1a and a switch unit ("SW") 1b. The latch unit 1a has an input terminal connected to a line connected to the bus 2 and a circuit (not shown) which is related to the bus control circuit 1 and which receives an input signal "IN" which has been transferred over the bus 2. The bus control circuit 1 can be included in the circuit or the LSI chip or connected thereto as an external circuit. The latch unit 1a has an output terminal connected to a first stationary contact of the switch unit 1b. The latch unit 1a has a control terminal which receives a bus control signal, which enables and disables the latch unit 1a. The bus control signal is supplied from the device related to the bus control circuit 1 or one of the circuits 3a and 3b. The switch unit 1b has a second stationary contact, which receives an output signal OUT to be transferred over the bus 2, and a movable contact which is selectively connected to are of the first and second stationary contacts in response to the bus control signal applied to the control terminal of the switch unit 1b. A CMOS circuit, such as a CMOS inverter (not shown), receives the signal OUT to be transferred over the bus 2 and outputs it to the switch unit 1b.

When the circuit related to the bus control circuit 1 has the output signal OUT to be transferred over the bus 2, it outputs the output signal OUT to the switch unit 1b. In this state, the switch unit 1b selects the output signal OUT in response to the bus control signal supplied from the circuit. In response to the output signal OUT, the bus 2 switches to the active state. The output signal OUT is then latched in the latch unit 1a. When sending of the output signal OUT is completed and the bus 2 is switched to the inactive state, the switch unit 1b selects the latch unit 1a, whereby the signal level of the bus 2 is fixed to the signal level theretofore set when the bus 2 was in the active state.

When one of the circuits 3a and 3b switches to an output state, in which there is an output signal to be transferred over the bus 2, and the bus 2 switches to the active state, the latch unit 1a latches a signal output by the one of the circuits 3a and 3b which is in the output state. When the bus 2 switches to the inactive state, the switch unit 1b selects the latch unit 1a in response to the bus control signal, so that the signal level of the bus 2 is fixed to the signal level which was set in the latch unit 1a when the bus 2 was in the active state.

According to the first aspect of the present invention, the signal level output to the bus 2, when the bus 2 is in the active state, is stored in the latch unit 1a, and the signal level thus stored in the latch unit 1a is output to the bus 2 via the switch unit 1b so that the bus 2 is fixed to the signal level determined by the latch unit 1a. Hence, it becomes possible to reduce the number of changes in the signal levels of the CMOS circuits connected to the bus 2 and hence to reduce energy consumed therein.

Figure 2B:
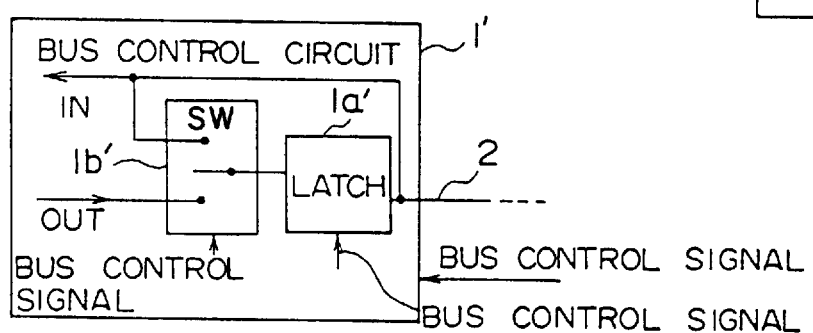
FIG. 2B is a block diagram showing a second aspect of the present invention.

FIG. 2B shows a second aspect of the present invention. A bus control circuit 1' includes a latch unit 1a' and a switch unit 1b'. The latch unit 1a' is connected between the bus 2 and the switch unit 1b'. The first stationary contact of the switch unit 1b' is connected to the bus 2, and the second stationary contact thereof receives the output signal OUT to be transmitted over the bus 2. The movable contact of the latch unit 1a' is connected to the switch unit 1b'. The latch unit 1a' is controlled by a bus control signal output by a circuit (not shown) related to the bus control circuit 1' or one of circuits (not shown) connected to the bus, and the switch unit 1b' is controlled by a circuit (not shown) related to the bus control circuit 1' or circuits (not shown) connected to the bus 2. When the bus 2 is in the active state, the latch circuit 1a' holds the signal on the bus 2 via the switch unit 1b'. When the bus 2 switches to the inactive state, the signal held in the latch unit 1a' is output to the bus 2. Hence, the same advantages as those of the structure shown in FIG. 2A can be obtained.

Figure 2C:
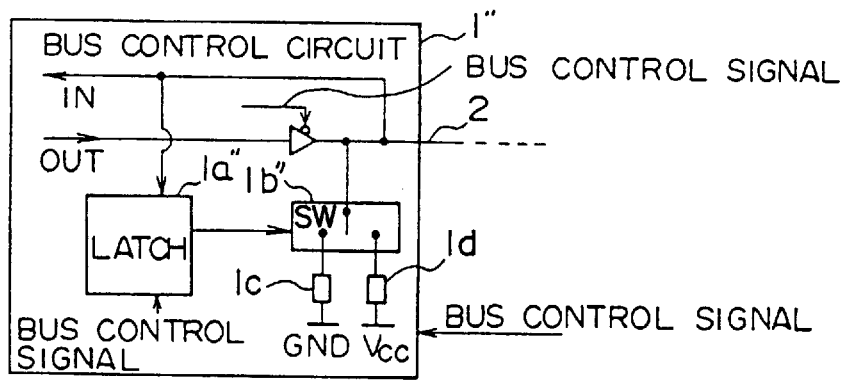
FIG. 2C is a block diagram showing a third aspect of the present invention.

FIG. 2C shows a third aspect of the present invention. A bus control circuit 1" includes a latch unit 1a", a switch unit 1b", a pull-down resistor 1c and a pull-up resistor 1d. The latch unit 1a", which is controlled by a circuit (not shown) related to the bus control circuit 1" or one of circuits (not shown) connected to the bus 2, latches the signal on the bus 2 and outputs the latched signal to the switch unit 1b". The switch unit 1b", which is controlled by the output signal of the latch unit 1a", selects either the pull-down resistor 1c or the pull-up resistor 1d. When the bus 2 is in the active state, the latch unit 1a" latches the signal on the bus 2. When the bus 2 switches to the inactive state, the switch unit 1b" selects either the pull-down resistor 1c or the pull-up resistor 1d on the basis of the level of the signal latched in the latch unit 1a". Hence, in the inactive state, the bus 2 is fixed to the signal level which was obtained immediately before the bus 2 switches to the inactive state.

Figure 3:
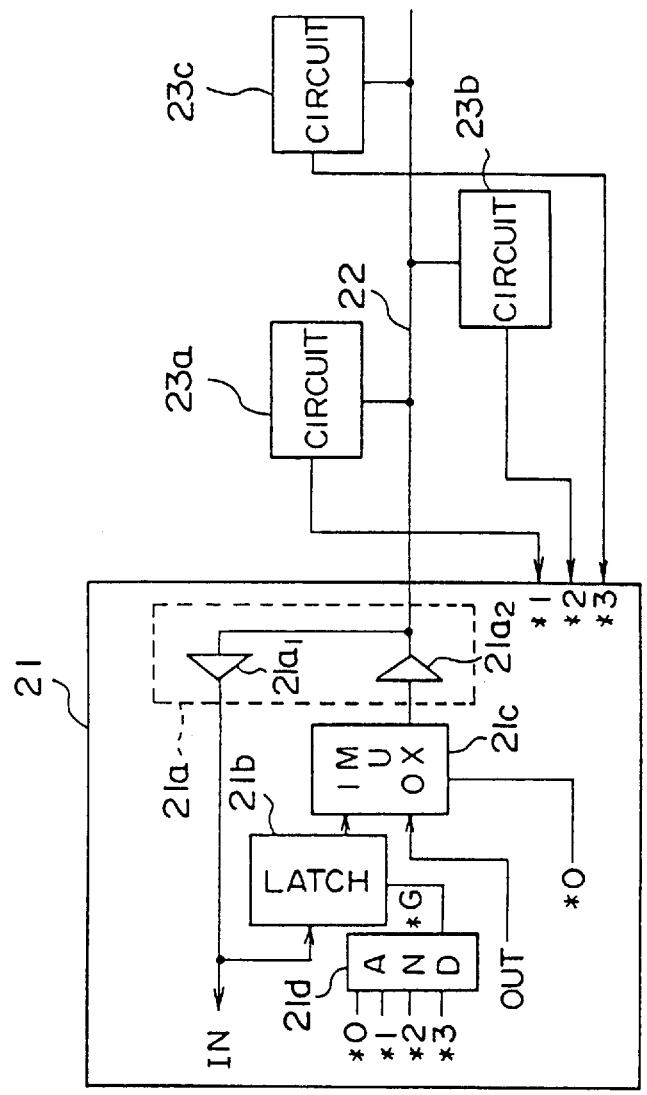
FIG. 3 is a block diagram of a bus control circuit according to a first embodiment of the present invention based on the structure shown in FIG. 2A.

FIG. 3 is a block diagram of a bus control circuit according to a first embodiment of the present invention based on the structure shown in FIG. 2A. A bus control circuit 21 is connected to a bus 22 to which circuits 23a, 23b and 23c are connected. The bus control circuit 21 includes an input/output buffer 21a, a through latch (also referred to as a level latch) circuit 21b, a multiplexer (MUX) 21c and an AND gate 21d.

Figure 4:
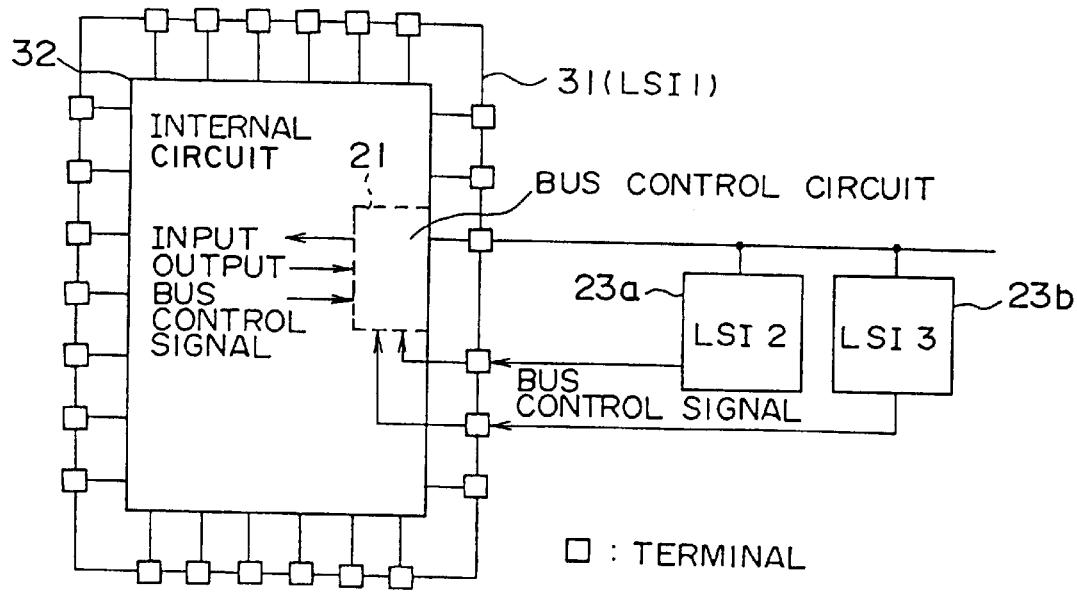
FIG. 4 is a block diagram of an LSI device in which the bus control circuit shown in FIG. 3 is provided.

As shown in FIG. 4, the bus control circuit 21 shown in FIG. 3 is provided in an LSI device 31, which is, for example, an application specific integrated circuit device such as a gate array. The LSI device 31 has an internal circuit such as a gate array circuit. The bus control circuit 21 is electrically connected to the internal circuit 32 of the LSI device 31. The bus control circuit 21 thus may be provided in an LSI device for use in bus control.

Turning to FIG. 3 again, the input/output buffer 21a includes an input buffer $21a_1$ and an output buffer $21a_2$, each of which buffers includes a CMOS circuit.

Figure 5A:
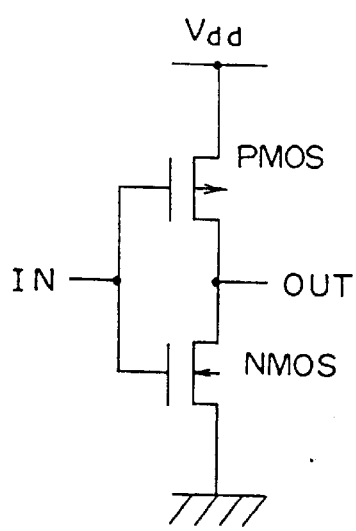
FIG. 5A is a circuit diagram of a CMOS inverter used as a buffer provided in the bus control circuit.

FIG. 5A shows a first example of each of the buffers $21a_1$ and $21a_2$. Each of the buffers $21a_1$ and $21a_2$ is connected between a power supply line Vdd and ground, and is formed with a CMOS inverter made up of a P-channel MOS transistor PMOS and an N-channel MOS transistor NMOS. Each time the state of the CMOS inverter changes, a pass-through current flows therein.

Figure 5B:
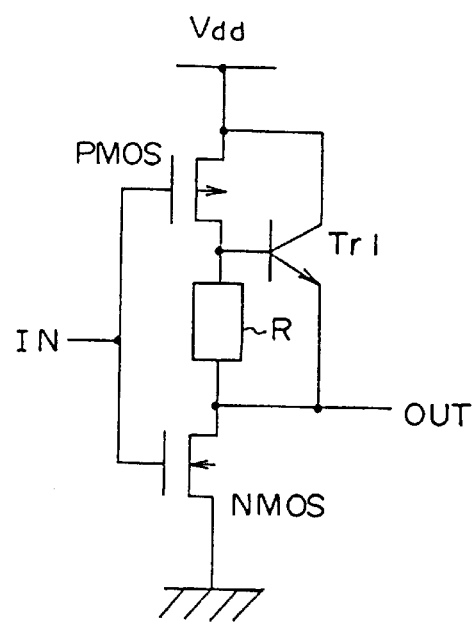
FIG. 5B is a circuit diagram of a Bi-CMOS inverter used as a buffer provided in the bus control circuit.

FIG. 5B shows a second example of each of the buffers $21a_1$ and $21a_2$. Each of the buffers $21a_1$ and $21a_2$ is formed with a Bi-CMOS circuit made up of a PMOS transistor PMOS, an NMOS transistor NMOS, a bipolar transistor Tr1 and a resistor R. The resistor R is connected between the source of the PMOS transistor PMOS and the drain of the NMOS transistor NMOS. Each time the state of the CMOS inverter changes, a pass-through current flows therein.

Turning to FIG. 3 again, the through latch circuit 21b is in the through state when a control signal *G applied thereto is low, and is in the hold state when the control signal *G is high. The through latch circuit 21b allows the input signal from the input/output buffer 21a to pass through the multiplexer 21c in the through state, and latches the input signal in the hold state. The multiplexer 21c is controlled by an output control signal *0 output by a related part of the internal circuit 32 shown in FIG. 4. When the output control signal *0 is at the low level, the multiplexer 21c selects an output signal OUT output by a related part of the internal circuit 32. When the output control signal *0 is at the high level, the multiplexer 21c selects the output signal of the through latch circuit 21b. The AND gate 21d receives the above-mentioned output control signal *0 and output control signals *1, *2 and *3 respectively output by circuits 23a, 23b and 23c which are, for example, LSI devices such as memory devices. The circuits 23a, 23b and 23c output low-level such output control signals when the circuits are in the output states, and output high-level such output control signals when the circuits are in the input states. It will be noted that only one of the circuits 23a, 23b and 23c switches to the output state at one time. The AND gate 21d derives the control signal *G.

When the bus control circuit 21 outputs the output signal OUT to the bus 22, the bus control circuit 21 switches the output control signal *0 to the low level, which causes the multiplexer 21c to select the output signal OUT. Hence, the output signal OUT is output to the bus 22 via the multiplexer 21c and the output buffer $21a_2$ of the input/output buffer 21a. Further, the output signal OUT is applied to the through latch circuit 21b via the input buffer $21a_1$ of the input/output buffer 21a. At this time, the output control signals *1, *2 and *3 are high and the output control signal *0 is low. Hence, the output signal of the AND gate 21d is low and thus the through latch 21b is in the through state.

When the output control signal *0 switches to the high level and the bus 22 is returned to the inactive state, the through latch circuit 21b holds the signal on the bus 22, and the multiplexer 21c selects the output signal of the through latch circuit 21b. The signal held in the through latch circuit 21b is output to the bus 22 via the multiplexer 21c and the output buffer $21a_2$ of the input/output buffer 21a. Hence, the bus 22 is fixed to the signal level which was set immediately before the bus 22 was switched to the inactive state.

When any one of the circuits 23a, 23b and 23c outputs a signal to the bus control circuit 21 via the bus, the corresponding one of the output control signals *1, *2 and *3 is switched to the low level. Hence, the output signal *G of the AND gate 21d is switched to the low level, so that the through latch circuit 21d assumes the through state. The output control signal *0 is high because the bus control circuit 21 is in the input state. Hence, the multiplexer 21c selects the output signal of the through latch circuit 21b, the above output signal being output to the bus 22 via the multiplexer 21C and the output buffer $21a_2$.

Then, one of the output control signals *1, *2 and *3 of the circuits 23a, 23b and 23c returns to the high level, and the bus 22 switches to the inactive state, the output signal *G of the AND gate 32d is switched to the high level and the through latch circuit 21b is switched to the hold state. The signal held in the through latch circuit 21b is output to the bus 22 via the multiplexer 21c and the output buffer $21a_2$. Hence, the bus 22 is fixed to the level of the signal output immediately before the corresponding one of the circuits 23a, 23b and 23c.

Figure 6:
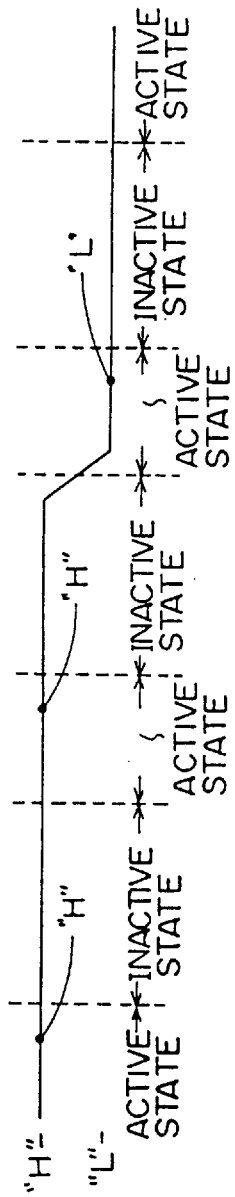
FIG. 6 is a time chart of showing the operation of a bus shown in FIG. 3.

FIG. 6 is a time chart of the operation of the first embodiment of the present invention shown in FIG. 3. As shown in FIG. 6, when a high-level signal is output to the bus 22, which is in the active state, the through latch circuit 21b holds the high-level signal obtained in the active state. Even when the bus 22 switches to the inactive state, the bus 22 is maintained in the high-level state. When the bus 22 switches to the active state from the above state and a low-level signal is output to the bus 22, the low-level signal is held in the through latch circuit 21b. Even when the bus 22 switches to the inactive state, the bus 22 is maintained in the low-level state.

As a result, as shown in FIG. 6, the level of the signal on the bus 22 changes only when the signal on the bus 22 switches to the low level. Hence, it can be seen from FIGS. 1A, 1B and 6 that the number of times that the signal level of the bus 22 changes can be reduced and energy consumed in the bus control circuit 21 can be reduced.

Figure 7:
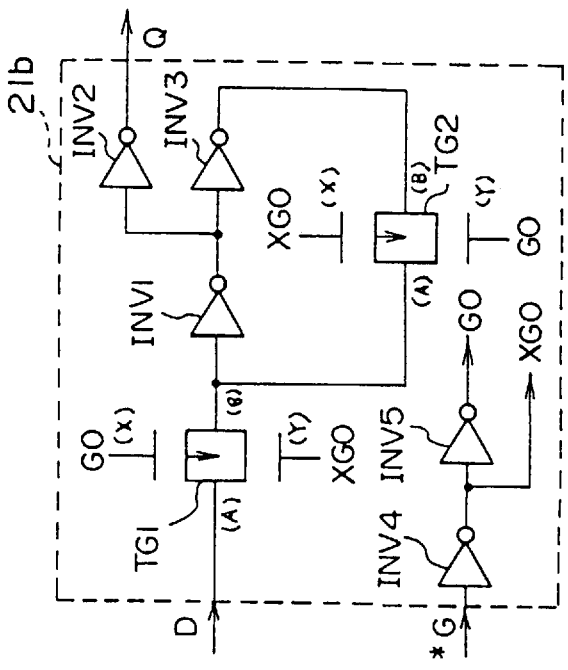
FIG. 7 is a circuit diagram of a through latch circuit shown in FIG. 3.

FIG. 7 is a block diagram of the through latch circuit 21b, which is made up of transmission gates TG1 and TG2 and inverters INVI, INV2, INV3, INV4 and INV5. In FIG. 7, D denotes the output signal of the input buffer $21a_1$ shown in FIG. 3, and *G denotes the output signal of the AND gate 21d. Further, Q denotes the output signal of the through latch circuit 21b, which is applied to the multiplexer 21c. Table 1 is the truth table of the through latch circuit 21b shown in FIG. 7.

TABLE 1

| Input | | Output |
|---|---|---|
| D | *G | Q |
| X | H | Hold |
| H | L | H |
| L | L | L |

H: high level
L: low level
X: don't care operates as shown in Table 2, in which symbols shown in Table 2 are shown in FIG. 7.

TABLE 2

| X | Y | Between A–B |
|---|---|---|
| L | H | ON |
| H | L | OFF |

Figure 8:
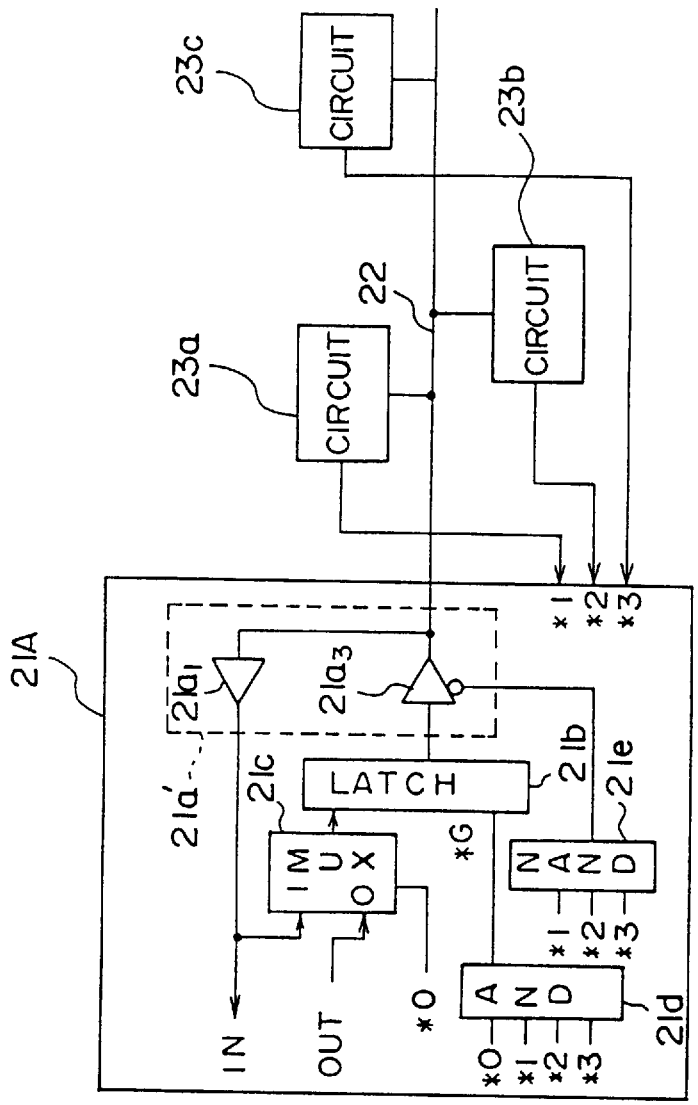
FIG. 8 is a block diagram of a bus control circuit according to a second embodiment of the present invention based on the structure shown in FIG. 2B.

FIG. 8 is a block diagram of a bus control circuit according to a second embodiment of the present invention, which is based on the structure shown in FIG. 2B. In FIG. 8, parts that are the same as those shown in the previously described figures are given the same reference numbers. A bus control circuit 21A shown in FIG. 8 is made up of an input/output buffer 21a' including buffers $21a_1$ and $21a_3$, the through latch circuit 21b, the multiplexer 21c, AND gate 21d and a NAND gate 21e. The output buffer $21a_3$ is formed with a CMOS circuit having a control terminal such as a transmission gate. The multiplexer 21c selects either the output signal of the input buffer $21a_1$ or the output signal OUT to be transferred over the bus 22 according to the output control signal *0. The through latch circuit 21b is provided between the multiplexer 21c and the output buffer $21a_3$. The output buffer $21a_3$ is controlled by the NAND gate 21e, which performs the NAND logic operation on the output control signals *1, *2 and *3 respectively output by the circuits 23a, 23b and 23c.

When the output signal OUT is output to the bus 22 from the bus control circuit 21A, the output control signal *0 switches to the low level and the multiplexer 21c selects the output signal OUT. Hence, the output signal OUT is applied to the through latch circuit 21b via the multiplexer 21c. Since the output control signal *0 is low, the output signal of the AND gate 21d is low, and the through latch circuit 21b is in the through state. Further, the circuits 23a, 23b and 23c are in the input state, and the output control signals *1, *2 and *3 are high. Hence, the output signal of the NAND gate 21e is low.

Hence, the output buffer $21a_3$ of the input/output buffer 21a' is in the conducting state (ON), and the output signal OUT from the bus control circuit 21A is output to the bus 22 via the multiplexer 21c, the through latch circuit 21b and the output buffer $21a_3$.

When the output control signal *0 switches to the high level and the bus 22 switches to the inactive state, the multiplexer 21c selects the output signal of the input buffer $21a_1$ of the input/output buffer 21a'. When the output control signal *0 switches to the high level, the output signal *G of the AND gate 21d is switched to the high level, so that the through latch circuit 21b is switched to the hold state. The value output to the bus 22 immediately before the bus 22 switches to the inactive state is output to the bus 22 via the input/output buffer 21a', and the bus 22 is retained in the level output immediately before the bus 22 switches to the inactive state.

When any one of the circuits 23a, 23b and 23c outputs a signal to the bus control circuit 21A, a corresponding one of the output control signals *1, *2 and *3 switches to the low level, and the output signal of the AND gate 21d is switched to the low level. Hence, the through latch circuit 21b is switched to the through state. The output control signal *0 is high because the bus control circuit 21A is in the input state. The multiplexer 21c selects the output signal of the input buffer $21a_1$, and applies same to the through latch circuit 21b. At this time, the through latch circuit 21b is in the through state and the output signal of the NAND gate 21e is high. Hence, the output buffer $21a_3$ is in the inactive (OFF) state.

When the output control signal being considered returns to the high level and the bus 22 is switched to the inactive state, the output signal *G of the AND gate 21d is switched to the high level, so that the through latch circuit 21b is returned to the hold state. Further, the output signal of the NAND gate 21e is switched to the low level, so that the output buffer $21a_3$ is switched to the active state. Hence, the signal held in the through latch circuit 21b is output to the bus 22 via the output buffer $21a_3$, so that the bus 22 is fixed to the signal level output by the related circuit, immediately before the bus 22 is switched to the inactive state.

According to the second embodiment of the present invention, the number of times that the signal level of the bus 22 changes can be reduced and energy consumed in the bus control circuit 21A can be reduced.

Figure 9:
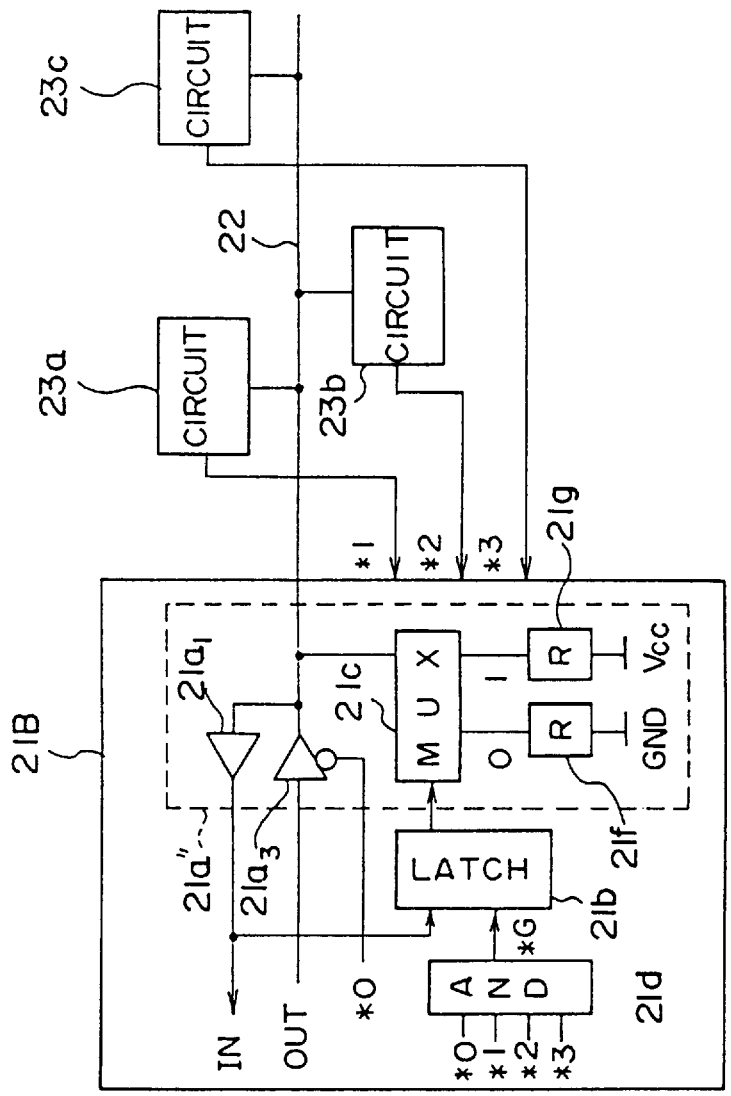
FIG. 9 is a block diagram of a bus control circuit according to a third embodiment of the present invention based on the structure shown in FIG. 2C.

FIG. 9 is a block diagram of a bus control circuit according to a third embodiment of the present invention based on the structure shown in FIG. 2C. In FIG. 9, parts that are the same as those shown in the previously described figures are given the same reference numbers.

A bus control circuit 21B shown in FIG. 9 is made up of an input/output buffer 21a", the through latch circuit 21b and the AND gate 21d. The input/output buffer 21a" includes the input buffer $21a_1$, the output buffer $21a_3$, the multiplexer 21c, a pull-down resistor 21f and a pull-up resistor 21g. The multiplexer 21c selects either the pull-down resistor 21f or the pull-up resistor 21g on the basis of the output signal of the through latch circuit 21b. The output terminal of the multiplexer 21c is connected to the bus.

When the output control signal *0 is low, the output gate of the AND gate 21d is low and the through latch circuit 21b is in the through state. The multiplexer 21c connects either the pull-down resistor 21f or the pull-up resistor 21g, on the basis of the output signal to be sent, to the bus 22. For example, when the signal on the bus 22 is high, the multiplexer 21c selects the pull-up resistor 21g and connects it to the bus 22. When the signal on the bus 22 is low, the multiplexer 21c selects the pull-down resistor 21g and connects it to the bus 22.

When the output control signal *0 switches to the high level whereby the bus 22 is switched to the inactive state, the output signal *G of the AND gate 21d is switched to the high level and the through latch circuit 21b is switched to the hold state. Hence, the multiplexer 21c holds, on the signal level output to the bus 22, the respective state in which either the pull-up resistor 21g or the pull-down register 21f is connected to the bus 22. For example, when the signal on the bus 22 is high, the multiplexer 21c selects the pull-up resistor 21g and connects it to the bus 22. When the signal on the bus 22 is low, the multiplexer 21c selects the pull-down resistor 21f and connects it to the bus 22. That is, the level of the bus 22 is held at the level output from the bus control circuit 21B immediately prior to the state change of the bus 22.

When any one of the circuits 23a, 23b and 23c outputs a signal to the bus control circuit 21B, a corresponding one of the output control signals *1, *2 and *3 is switched to the low level. Hence, the output signal of the AND gate 21d is switched to the low level, and the through latch circuit 21d is switched to the through state.

Since the bus control circuit 21B is in the input state, the output control signal *0 is high, and the output buffer $21a_3$ of the input/output buffer 21a" is in the inactive state (OFF). Hence, the signal on the bus 22 is input to the through latch circuit 21b via the input buffer $21a_1$. The multiplexer 21c connects, on the basis of the signal output to the bus 22, either the pull-up resistor 21g or the pull-down resistor 21f. For example, when the signal on the bus 22 is high, the multiplexer 21c selects the pull-up resistor 21g and connects it to the bus 22. When the signal on the bus 22 is low, the multiplexer 21c selects the pull-down resistor 21f and connects it to the bus 22.

When the related output control signal from one of the circuits 23a, 23b and 23c returns to the high level whereby the bus 22 is switched to the inactive state, the output signal *G of the AND gate 21d is switched to the high level, and the through latch circuit 21b is switched to the hold state. Hence, the multiplexer 21c selects either the pull-up resistor 21g or the pull-down resistor 21f on the basis of the signal output to the bus 22. For example, the output signal on the bus 22 is high, the multiplexer 21c selects the pull-up resistor 21g and connects it to the bus 22. When the signal on the bus 22 is low, the multiplexer 21c selects the pull-down resistor 21f and connects it to the bus. That is, the bus 22 is retained at the level which was output from the related one of the circuits 23a, 23b and 23c immediately before the bus 22 was switched to the inactive state.

According to the third embodiment of the present invention, the number of times that the signal level of the bus 22 changes can be reduced and energy consumed in the bus control circuit 21B can be reduced. In addition, the bus 22 is fixed to the level defined by the pull-down resistor 21f or the pull-up resistor 21g, so that even if a bus conflict or fight for the bus control circuit 21B occurs in which one of the circuits 23a, 23b and 23c concurrently outputs a signal to the bus 22, a transient current can be reduced by means of the pull-down resistor 21g and the pull-down resistor 21f.

The present invention is not limited to the specifically disclosed embodiments in which a system includes one bus control circuit and three electronic circuits. For example, the present invention includes a system in which there are provided one bus control circuit and a plurality of electronic devices or LSI devices. The bus control circuit performs concentric management of electronic circuits or LSI devices connected together via a bus.

The present invention is not limited to the specifically disclosed embodiments, and variations and modifications may be made without departing from the scope of the present invention.

What is claimed is:

1. A method for controlling a bus to which a bus control circuit and at least one electronic circuit are connected, said method comprising:

storing a latest signal level which is output to, and input from, the electronic circuit via the bus when the bus is in an active state; and fixing the bus to a signal level stored in the storing step when the bus switches to an inactive state.

2. The method as claimed in claim 1, wherein the fixing step comprises the step of connecting a resistance element to the bus on the basis of the signal level stored in the storing step.

3. A bus control circuit for controlling a bus to which at least one electronic circuit is connected, said bus control circuit comprising:

means for storing a latest signal level which is output to, and input from, said electronic circuit via the bus when the bus is in an active state; and means for fixing the bus to the latest signal level stored in the first means when the bus switches to an inactive state.

4. A bus control circuit for controlling a bus to which at least one electronic circuit is connected, said bus control circuit comprising:

storing means for storing a signal level which is output to the bus when the bus is in an active state; and fixing means for fixing the bus to the signal level stored in the first means when the bus switches to an inactive state, wherein the storing means further comprises latch means for latching the signal level of the bus when the bus is in the active state; and the fixing means further comprises switch means for outputting, to the bus, either the signal level of the bus latched in the latch means or an output signal to be sent to the bus according to an output control signal indicating that the bus should be set to the active state or the inactive state, said switch means outputting the signal level of the bus latched in the latch means to the bus when the bus is switched to the inactive state.

5. The bus control circuit as claimed in claim 3, wherein:

the fixing means further comprises switch means for outputting either the signal level of the bus or an output signal to be sent to the bus according to an output control signal indicating that the bus should be set to the active state or the inactive state; and the storing means comprises latch means for latching a selected signal from the switch means when the bus is in the active state and for outputting a latched, selected signal to the bus when the bus is switched to the inactive state.

6. The bus control circuit as claimed in claim 3, wherein:

the storing means further comprises latch means for latching the signal level of the bus when the bus is in the active state; and the fixing means further comprises switch means for connecting, on the basis of the signal level latched in the latch means, either a pull-up resistor or a pull-down resistor to the bus when the bus is switched to the inactive state.

7. A semiconductor integrated circuit device having a bus control circuit for controlling a bus to which an integrated circuit device is connected, said semiconductor integrated circuit device comprising:

means for storing a latest signal level output to, and input from, the electronic circuit via the bus when the bus is in an active state; and means for fixing the bus to the latest signal level stored in the storing means when the bus switches to an inactive state.

8. A semiconductor integrated circuit device for controlling a bus to which one integrated circuit device is connected, said semiconductor integrated circuit device comprising:

storing means for storing a signal level which is output to the bus when the bus is in an active state; and fixing means for fixing the bus to the signal level stored in the first means when the bus switches to an inactive state, wherein the storing means further comprises latch means for latching the signal level of the bus when the bus is in the active state; and the fixing means further comprises switch means for outputting, to the bus, either the signal level of the bus latched in the latch means or an output signal to be sent to the bus according to an output control signal indicating that the bus should be set to the active state or the inactive state, respectively, said switch means outputting the signal level of the bus, as latched in the latch means, to the bus when the bus is switched to the inactive state.

9. The semiconductor integrated circuit device as claimed in claim 7, wherein:

the fixing means further comprises switch means for outputting either the signal level of the bus or an output signal to be sent to the bus according to an output control signal indicating that the bus should be set to the active state or the inactive state; and the storing means further comprises latch means for latching a selected signal from the switch means when the bus is in the active state and for outputting a latched, selected signal to the bus when the bus is switched to the inactive state.

10. The semiconductor integrated circuit device as claimed in claim 7, wherein:

the storing means further comprises latch means for latching the signal level of the bus when the bus is in the active state; and the fixing means further comprises switch means for connecting, on the basis of the signal level latched in the latch means, either a pull-up resistor or a pull-down resistor to the bus when the bus is switched to the inactive state.

11. A bus control circuit to control a bus to which at least one electronic circuit is connected, said bus control circuit comprising:

means for storing a latest signal which is output to, and input from, the electronic circuit via the bus when the bus is in an active state; and means for outputting the latest signal level stored in the storing means to the bus when the bus switches to an inactive state.

12. A semiconductor integrated circuit device having a bus control circuit to control a bus to which an integrated circuit device is connected, said semiconductor integrated circuit device comprising:

means for storing a latest signal which is output to, and input from, the integrated circuit device via the bus when the bus is in an active state; and means for outputting the latest signal level stored in the storing means to the bus when the bus switches to an inactive state.

13. A bus control circuit to control a bus to which at least one electronic circuit is connected, said bus control circuit comprising:

a storage unit to store a latest signal which is output to, and input from, the electronic circuit via the bus when the bus is in an active state; and an output unit to output the latest signal level stored in the storage unit to the bus when the bus switches to an inactive state.

* * * * *

UNITED STATES PATENT AND TRADEMARK OFFICE
CERTIFICATE OF CORRECTION

PATENT NO.:    5,808,490
DATED     :    September 15, 1998
INVENTOR(S):   Hiroaki WATANABE It is certified that error appears in the above-identified patent and that said Letters Patent is hereby corrected as shown below:

Col. 3,    line 63, after "OUT" insert --,--.

Col. 7,    line 12, before "operates" insert --Each of the transmission gates TG1 and TG2--.

Signed and Sealed this

Sixteenth Day of March, 1999

Attest:

Attesting Officer

Q. TODD DICKINSON

Acting Commissioner of Patents and Trademarks